United States Patent
Park et al.

(10) Patent No.: US 11,646,716 B2
(45) Date of Patent: May 9, 2023

(54) ACOUSTIC RESONATOR FILTER

(71) Applicant: SAMSUNG ELECTRO-MECHANICS CO., LTD., Suwon-si (KR)

(72) Inventors: Chan Hee Park, Suwon-si (KR); Sung Tae Kim, Suwon-si (KR); Jung Woo Sung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 219 days.

(21) Appl. No.: 17/201,162

(22) Filed: Mar. 15, 2021

(65) Prior Publication Data

US 2022/0158620 A1 May 19, 2022

(30) Foreign Application Priority Data

Nov. 16, 2020 (KR) .................. 10-2020-0152505

(51) Int. Cl.
*H03H 9/54* (2006.01)
*H03H 9/60* (2006.01)
*H03H 9/17* (2006.01)

(52) U.S. Cl.
CPC ............ *H03H 9/542* (2013.01); *H03H 9/17* (2013.01); *H03H 9/605* (2013.01)

(58) Field of Classification Search
CPC .......... H03H 9/17; H03H 9/54; H03H 9/572; H03H 9/70; H03H 9/703; H03H 9/72
See application file for complete search history.

(56) References Cited

U.S. PATENT DOCUMENTS

| | | | |
|---|---|---|---|
| 9,543,924 B2 * | 1/2017 | Watanabe | H03H 9/6483 |
| 2009/0201104 A1 * | 8/2009 | Ueda | H03H 9/6483 333/195 |
| 2010/0110940 A1 | 5/2010 | Hara et al. | |
| 2015/0295559 A1 | 10/2015 | White et al. | |
| 2021/0313964 A1 * | 10/2021 | Sung | H03H 9/568 |

FOREIGN PATENT DOCUMENTS

| | | |
|---|---|---|
| JP | 5072047 B2 | 11/2012 |
| JP | 2014068123 A * | 4/2014 |

OTHER PUBLICATIONS

Komatsu, Tomoya, et al. "Design of Narrow Bandwidth Ladder-Type Filters with Sharp Transition Bands Using Mutually Connected Resonator Elements." *IEEE Transactions on Ultrasonics, Ferroelectrics, and Frequency Control* 56.7 (2009): 1451-1456. (4 pages in English).

\* cited by examiner

*Primary Examiner* — Long Nguyen
(74) *Attorney, Agent, or Firm* — NSIP Law

(57) ABSTRACT

An acoustic resonator filter includes: a series unit including at least one series acoustic resonator electrically connected, in series, between first and second ports configured to pass a radio frequency (RF) signal; a first shunt unit disposed on a first shunt connection path between the at least one series acoustic resonator and a ground, the first shunt unit including a plurality of shunt acoustic resonators connected to each other in series and having different resonance frequencies; and a second shunt unit disposed in a second shunt connection path between the at least one series acoustic resonator and the ground, the second shunt unit including at least one shunt acoustic resonator and having higher inductance than inductance of the first shunt unit.

14 Claims, 9 Drawing Sheets

ACOUSTIC RESONATOR FILTER

CROSS-REFERENCE TO RELATED APPLICATIONS

This application claims the benefit under 35 U.S.C. § 119(a) of Korean Patent Application No. 10-2020-0152505 filed on Nov. 16, 2020 in the Korean Intellectual Property Office, the entire disclosure of which is incorporated herein by reference for all purposes.

BACKGROUND

1. Field

The following description relates to an acoustic resonator filter.

2. Description of Related Art

Recently, with the rapid development of mobile communication devices, chemical and biological testing devices, and other electronic devices, demand for small and lightweight filters, oscillators, resonant elements, acoustic resonant mass sensors used in these devices has increased.

An acoustic resonator such as a bulk acoustic wave (BAW) filter may be configured as a means for implementing a small and lightweight filter, an oscillator, a resonant element, an acoustic resonant mass sensor, and other components, since the acoustic resonator is very small and has good performance, compared with a dielectric filter, a metal cavity filter, and a waveguide, for example. Such an acoustic resonator is widely used in communication modules of modern mobile devices that require good performance (e.g., wide pass bandwidth).

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator filter includes: a series unit including at least one series acoustic resonator electrically connected, in series, between first and second ports configured to pass a radio frequency (RF) signal; a first shunt unit disposed on a first shunt connection path between the at least one series acoustic resonator and a ground, the first shunt unit including a plurality of shunt acoustic resonators connected to each other in series and having different resonance frequencies; and a second shunt unit disposed in a second shunt connection path between the at least one series acoustic resonator and the ground, the second shunt unit including at least one shunt acoustic resonator and having higher inductance than inductance of the first shunt unit.

The acoustic resonator filter may further include: a third shunt unit disposed in a third shunt connection path between the at least one series acoustic resonator and the ground, and including at least one shunt acoustic resonator having a resonance frequency lower than a higher resonance frequency among a plurality of resonance frequencies of the plurality of shunt acoustic resonators included in the first shunt unit, and lower than at least one resonance frequency of the at least one shunt acoustic resonator included in the second shunt unit.

The at least one resonance frequency of the at least one shunt acoustic resonator included in the third shunt unit may be the same as a lower resonance frequency among the plurality of resonance frequencies of the plurality of shunt acoustic resonators included in the first shunt unit.

The higher resonance frequency among the plurality of resonance frequencies of the plurality of shunt acoustic resonators included in the first shunt unit may be equal to or higher than at least one resonance frequency of the at least one series acoustic resonator.

The higher resonance frequency among the plurality of resonance frequencies of the plurality of shunt acoustic resonators of the first shunt unit may be higher than the at least one resonance frequency of the at least one shunt acoustic resonator of the second shunt unit.

The acoustic resonator filter may further include: a plurality of third shunt units respectively arranged in a plurality of third shunt connection paths between the at least one series acoustic resonator and the ground. The plurality of third shunt units may each include at least one shunt acoustic resonator having a resonance frequency lower than a higher resonance frequency among the different resonance frequencies of the plurality of shunt acoustic resonators included in the first shunt unit.

The at least one series acoustic resonator included in the series unit may include a plurality of series acoustic resonators electrically connected between the plurality of third shunt units. The first shunt unit may be electrically connected between a node between the plurality of series acoustic resonators and the ground.

The first shunt unit includes a plurality of first shunt units arranged in a plurality of first shunt connection paths between the at least one series acoustic resonator and the ground. One of the plurality of first shunt units may include the plurality of shunt acoustic resonators. Another one of the plurality of first shunt units may include another plurality of shunt acoustic resonators connected to each other in series and having different resonance frequencies.

The at least one series acoustic resonator of the series unit may include one or more series acoustic resonators electrically connected between the plurality of first shunt units.

The second shunt unit may further include an inductor electrically connected to the at least one shunt acoustic resonator included in the second shunt unit, in series.

In another general aspect, an acoustic resonator filter includes: at least one series acoustic resonator electrically connected, in series, between first and second ports configured to pass a radio frequency (RF) signal; at least one second shunt acoustic resonator electrically shunt-connected between the at least one series acoustic resonator and a ground; a plurality of first shunt acoustic resonators electrically shunt-connected between the at least one series acoustic resonator and the ground, and having a resonance frequency higher than a resonance frequency of the at least one second shunt acoustic resonator; and an inductor electrically connected to a portion of the plurality of first shunt acoustic resonators in series. At least one first shunt acoustic resonator, among a remaining portion of the plurality of first shunt acoustic resonators, is electrically connected to the at least one second shunt acoustic resonator in series.

A resonance frequency of the at least one first shunt acoustic resonator among the remaining portion the plurality of first shunt acoustic resonators may be equal to or higher than a resonance frequency of the at least one series acoustic resonator.

A resonance frequency of the portion of the plurality of first shunt acoustic resonators may be lower than a resonance frequency of at least one first shunt acoustic resonator among a remaining portion of the plurality of first shunt acoustic resonators.

The at least one second shunt acoustic resonator may include a plurality of second shunt acoustic resonators. A number of the plurality of second shunt acoustic resonators may be greater than a number of the plurality of first shunt acoustic resonators.

A number of the at least one first shunt acoustic resonator, among the remaining portion of the plurality of first shunt acoustic resonators, electrically connected to the at least one second shunt acoustic resonator in series may be greater than a number of first shunt acoustic resonators, among the portion of the plurality of first shunt acoustic resonators electrically connected to the inductor in series.

An inductance of a shunt connection path in which the inductor is disposed may be greater than each of a plurality of inductances of a plurality of shunt connection paths in which the plurality of second shunt acoustic resonators are respectively disposed.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1A:
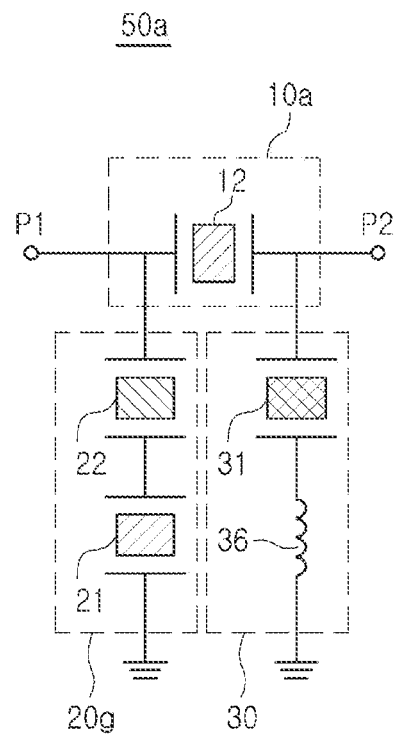
FIGS. 1A through 1H are diagrams illustrating acoustic resonator filters, according to embodiments.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure. Hereinafter, while embodiments of the present disclosure will be described in detail with reference to the accompanying drawings, it is noted that examples are not limited to the same.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween. As used herein "portion" of an element may include the whole element or less than the whole element.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as illustrated in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may be also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

The features of the examples described herein may be combined in various ways as will be apparent after an understanding of this disclosure. Further, although the examples described herein have a variety of configurations, other configurations are possible as will be apparent after an understanding of this disclosure.

Herein, it is noted that use of the term "may" with respect to an example, for example, as to what an example may include or implement, means that at least one example exists in which such a feature is included or implemented while all examples are not limited thereto.

FIG. 1A is a view illustrating an acoustic resonator filter 50a, according to an embodiment.

Referring to FIG. 1A, the acoustic resonator filter 50a may include a series unit 10a, a first shunt unit 20g, and a second shunt unit 30. A radio frequency (RF) signal may be allowed to pass through a first port P1 and a second port P2, or may be or blocked between the first port P1 and the second port P2, according to a frequency of the RF signal.

The acoustic resonator filter 50a may include at least one series acoustic resonator 12, a plurality of first shunt acoustic resonators 21 and 31, and at least one second shunt acoustic resonator 22.

An electrical connection node between the at least one series acoustic resonator 12, the plurality of first shunt acoustic resonators 21 and 31, and at least one second shunt acoustic resonator 22 may be implemented with a material having a relatively low resistivity, such as gold (Au), a gold-tin (Au—Sn) alloy, copper (Cu), a copper-tin (Cu—Sn) alloy, aluminum (Al), an aluminum alloy, etc., but is not limited to the aforementioned examples.

The at least one series acoustic resonator 12, the plurality of first shunt acoustic resonators 21 and 31, and the at least one second shunt acoustic resonator 22 may each convert electrical energy of the RF signal into mechanical energy through piezoelectric properties, and may convert mechanical energy into electrical energy through the piezoelectric properties. As the frequency of the RF signal becomes closer to a resonance frequency of the acoustic resonator, an energy transfer rate between a plurality of electrodes may be significantly increased. As the frequency of the RF signal becomes closer to an anti-resonance frequency of the acoustic resonator, the energy transfer rate between the plurality of electrodes may be significantly reduced. The anti-resonance frequency may be higher than the resonance frequency, according to the piezoelectric properties.

The at least one series acoustic resonator 12 may be electrically connected in series between the first and second ports P1 and P2. As as the frequency of the RF signal becomes closer to the resonance frequency, a pass rate of the RF signal between the first and second ports P1 and P2 may increase. As the frequency of the RF signal becomes closer to the anti-resonance frequency, the pass rate of the RF signal between the first and second ports P1 and P2 of the RF signal may decrease.

The at least one second shunt acoustic resonator 22 may be electrically shunt-connected between the at least one series acoustic resonator 12 and the ground. A pass rate of the RF signal to the ground may increase as the frequency of the RF signal becomes closer to the resonance frequency, and may decrease as the frequency of the RF signal becomes closer to the anti-resonance frequency.

The pass rate of the RF signal between the first and second ports P1 and P2 may decrease as the pass rate of the RF signal to the ground increases. The pass rate of the RF signal between the first and second ports P1 and P2 may increase as the pass rate of the RF signal directing the ground decreases.

That is, the pass rate of the RF signal between the first and second ports P1 and P2 may decrease as the frequency of the RF signal becomes closer to the resonance frequency of the at least one second shunt acoustic resonator 22 or closer to the anti-resonance frequency of the at least one series acoustic resonator 12.

Since the anti-resonance frequency is higher than the resonance frequency, the acoustic resonator filter 50a may have a pass bandwidth having a lowest frequency corresponding to the resonance frequency of the at least one second shunt acoustic resonator 22 and a highest frequency corresponding to the anti-resonance frequency of the at least one series acoustic resonator 12.

The pass bandwidth may increase as a difference between the resonance frequency of the at least one second shunt acoustic resonator 22 and the anti-resonance frequency of the at least one series acoustic resonator 12 increases. However, if the difference between the resonance frequency of the at least one second shunt acoustic resonator 22 and the anti-resonance frequency of the at least one series acoustic resonator 12 is too high, the pass bandwidth may be split.

If the resonance frequency of the at least one series acoustic resonator 12 is slightly higher than the anti-resonance frequency of the at least one second shunt acoustic resonator 22, a bandwidth of the acoustic resonator filter 50a may be wide but not split.

In an acoustic resonator, the difference between the resonance frequency and the anti-resonance frequency may be determined based on $kt^2$ (electromechanical coupling factor), physical properties of the acoustic resonator, and the resonance frequency and the anti-resonance frequency may be changed together if a size or shape of the acoustic resonator is changed.

The series unit 10a may include the at least one series acoustic resonator 12 electrically connected in series between the first and second ports P1 and P2.

The first shunt unit 20g may be disposed on a first shunt connection path between the at least one series acoustic resonator 12 and a ground, and may include the first and second shunt acoustic resonators 21 and 22 connected to each other in series and having different resonance frequencies. The resonance frequency of the first shunt acoustic resonator 21 may be higher than the resonance frequency of the second shunt acoustic resonator 22.

When the first and second shunt acoustic resonators 21 and 22 are electrically connected to each other in series, the first and second shunt acoustic resonators 21 and 22 may act as capacitors to each other, and thus, the first and second shunt acoustic resonators 21 and 22 may increase the resonance frequency of each other. Accordingly, the resonance frequencies of the first and second shunt acoustic resonators 21 and 22 may be closer to the anti-resonance frequencies of the first and second shunt acoustic resonators 21 and 22.

Accordingly, a transmission zero pole may be formed near the resonance frequencies of the first and second shunt acoustic resonators 21 and 22, may be formed near a bandwidth of the acoustic resonator filter 50a, and may improve an attenuation characteristic of the bandwidth. That is, the transmission zero pole may increase a rate of change of admittance according to the change in frequency (freq) at the lowest frequency and/or the highest frequency of the bandwidth, and provide a sharp skirt characteristic of the acoustic resonator filter 50a.

The second shunt unit 30 may be disposed in a second shunt connection path between the at least one series acoustic resonator 12 and a ground, and may include the at least one first shunt acoustic resonator 31. The second shunt unit 30 may have an inductance higher than the inductance of the first shunt unit 20g. For example, the second shunt unit 30 may further include an inductor 36 electrically connected to the at least one first shunt acoustic resonator 31 in series.

The first shunt acoustic resonator 31, which is a part of the plurality of first shunt acoustic resonators, may be electrically connected to the inductor 36 in series, and the first shunt acoustic resonator 21, which is another part of the plurality of first shunt acoustic resonators, may be electrically connected to the second shunt acoustic resonator 22 in series.

The additional inductance due to the addition of the inductor 36 of the second shunt unit 30 may contribute to the resonance frequency of the second shunt unit 30 and substantially may not contribute to the anti-resonance frequency of the second shunt unit 30. That is, the characteristics of the second shunt unit 30 having increased inductance may be similar to characteristics of the acoustic resonator having increased $kt^2$.

As the $kt^2$ increases, the difference between the resonance frequency and the anti-resonance frequency of the acoustic resonator 50a increases, so that the difference between the resonance frequency and the anti-resonance frequency of the second shunt unit 30 may be greater than that of the first shunt unit 20g.

Since the difference between the resonance frequency and the anti-resonance frequency of the second shunt unit 30 is greater than that of the first shunt unit 20g, the second shunt unit 30 may compensate for split of the pass bandwidth due to the significant increase in the difference between the resonance frequency of the second shunt acoustic resonator 22 of the first shunt unit 20g and the anti-resonance frequency of the at least one series acoustic resonator 12. Accordingly, the pass bandwidth of the acoustic resonator filter 50a may be further widened.

The second shunt unit 30 may further widen the bandwidth formed according to the combination of the first shunt unit 20g and the series unit 10a, and the first shunt unit 20g may make the skirt characteristic of the bandwidth formed according to the combination of the second shunt unit 30 and the series unit 10a sharper.

The acoustic resonator filter 50a obtains a wider pass bandwidth according to the second shunt unit 30 and a sharper skirt characteristic according to the first shunt unit 20g. In addition, since the acoustic resonator filter 50a may have a structure in which the first shunt unit 20g and the second shunt unit 30 are complementary to each other, a wide pass bandwidth and sharp skirt characteristic may be efficiently obtained, and a balance between the pass bandwidth and skirt characteristics may be more efficiently matched according to a standard required for the acoustic resonator filter 50a.

For example, the resonance frequency of the first shunt acoustic resonator 31 of the second shunt unit 30 may be higher than the resonance frequency of the second shunt acoustic resonator 22 of the first shunt unit 20g. For example, the resonance frequency of the first shunt acoustic resonator 21 of the first shunt unit 20g may be higher than the resonance frequency of the first shunt acoustic resonator 31 of the second shunt unit 30, or the resonance frequency of the first shunt acoustic resonator 21 of the first shunt unit 20g may be higher than or equal to the resonance frequency of the at least one series acoustic resonator 12.

Accordingly, the complementarity between the first shunt unit 20g and the second shunt unit 30 may be further improved, and thus, the acoustic resonator filter 50a may more efficiently obtain a wide pass bandwidth and a sharp skirt characteristic.

FIGS. 1B through 1H are views illustrating an acoustic resonator filters 50b through 50h, respectively, according to embodiments.

Figure 1B:
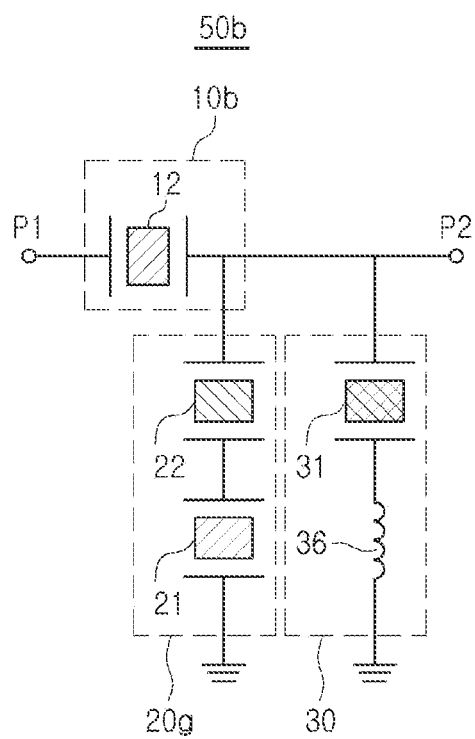

Referring to FIG. 1B, at least one series acoustic resonator 12 of a series unit 10b of the acoustic resonator filter 50b may be disposed to be closer to the first port P1, compared to the at least one series acoustic resonator 12 illustrated in FIG. 1A. Accordingly, the first shunt unit 20g and the second shunt unit 30 may be connected to each other without the at least one series acoustic resonator 12 being disposed between the first shunt unit 20g and the second shunt unit 30. That is, the series unit 10b may be connected between the first port P1 and the first shunt unit 20g.

Figure 1C:
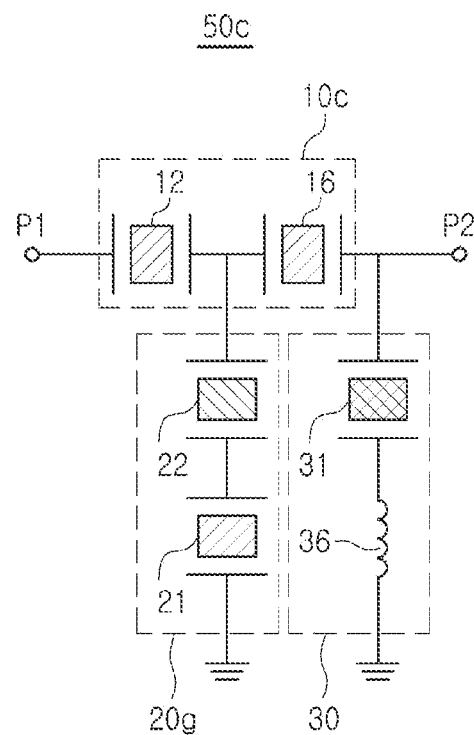

Referring to FIG. 1C, in the acoustic resonator filter 50c, a series unit 10c may include a plurality of series acoustic resonators 12 and 16, and the first shunt unit 20g may be electrically connected in series between a node between the plurality of series acoustic resonators 12 and 16 and a ground. The number of the plurality of series acoustic resonators 12 and 16 may be appropriately set according to a standard required for the acoustic resonator filter 50c.

Figure 1D:
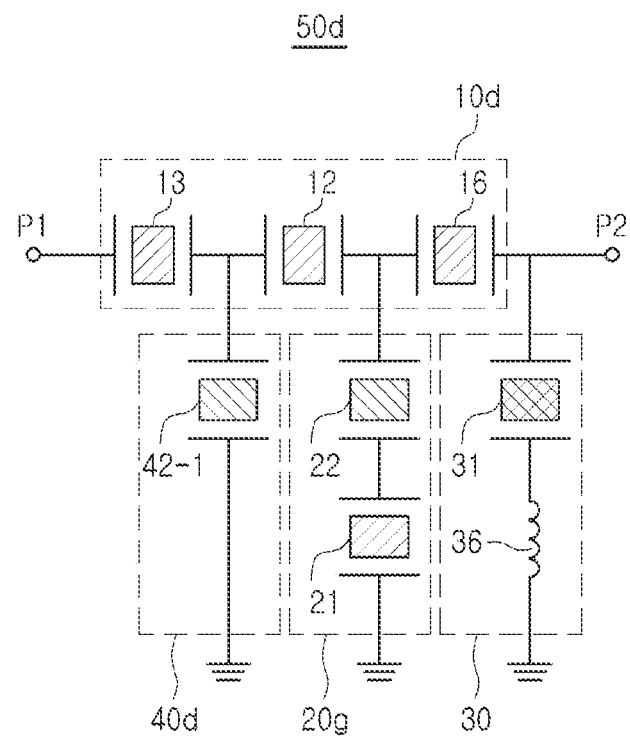

Referring to FIG. 1D, the acoustic resonator filter 50d may include a series unit 10d including a plurality of series acoustic resonators 12, 13, and 16, and may further include a third shunt unit 40d in addition to the first and second shunt units 20g and 30.

The third shunt unit 40d may be disposed in a third shunt connection path between the plurality of series acoustic resonators 12, 13, and 16 and a ground, and may include a second shunt acoustic resonator 42-1. For example, the third shunt unit 40d may be connected between a node between the series acoustic resonator 12 and the series acoustic resonator 13, and the ground. The second shunt resonator 42-1 may have a resonance frequency lower than a higher resonance frequency among a plurality of resonance frequencies of the first and second shunt acoustic resonators 21 and 22 of the first shunt unit 20g, and lower than the resonance frequency of the first shunt acoustic resonator 31 of the second shunt unit 30.

Accordingly, the second shunt acoustic resonator 42-1 of the third shunt unit 40d may form a pole near the lowest frequency of a bandwidth of the acoustic resonator filter 50d, and a skirt characteristic near the lowest frequency of the bandwidth of the acoustic resonator filter 50d may be sharper. For example, at least one resonance frequency of the second shunt acoustic resonator 42-1 of the third shunt unit 40d may be the same as a lower resonance frequency among a plurality of resonance frequencies of the first and second shunt acoustic resonators 21 and 22 of the first shunt unit 20g.

As the number of the plurality of series acoustic resonators 12, 13, and 16 of the series unit 10d increases, the skirt characteristic near the highest frequency of the bandwidth of the acoustic resonator filter 50d may become sharper.

An inductance of the second shunt unit 30 may be greater than an inductance of each of the first and third shunt units 20g and 40d.

Figure 1E:
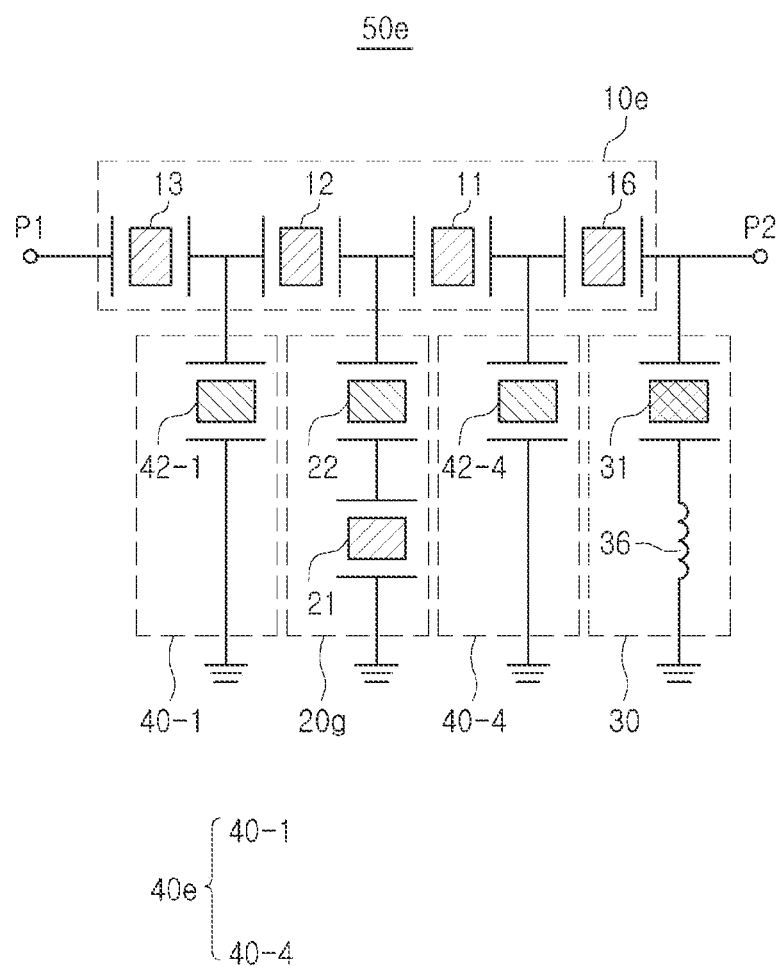

Referring to FIG. 1E, a third shunt unit 40e of the acoustic resonator filter 50e according to an exemplary embodiment in the present disclosure may include a plurality of third shunt units 40-1 and 40-4 each disposed in one of a plurality of third shunt connection paths between a plurality of series acoustic resonators 11, 12, 13, and 16 and a ground.

The plurality of third shunt units 40-1 and 40-4 may include second shunt acoustic resonators 42-1 and 42-4, respectively, having a resonance frequency lower than a higher resonance frequency among a plurality of resonance frequencies of the first and second shunt acoustic resonators 21 and 22 of the first shunt unit 20g.

A series unit 10e may include the series acoustic resonators 11 and 12 electrically connected between the plurality of third shunt units 40-1 and 40-4, and the first shunt unit 20g may be electrically connected between a node between the series acoustic resonators 11 and 12 and a ground.

Accordingly, the first shunt unit 20g may be disposed farther from the first and second ports P1 and P2 than the plurality of third shunt units 40-1 and 40-4, and may be relatively less affected by external noise or heat generated by power of the RF signal. Accordingly, a transmission zero pole formed by the first shunt unit 20g may be formed more stably (e.g., to be more resistant to temperature changes) and the acoustic resonator filter 50e may have a more stable skirt characteristic.

Figure 1F:
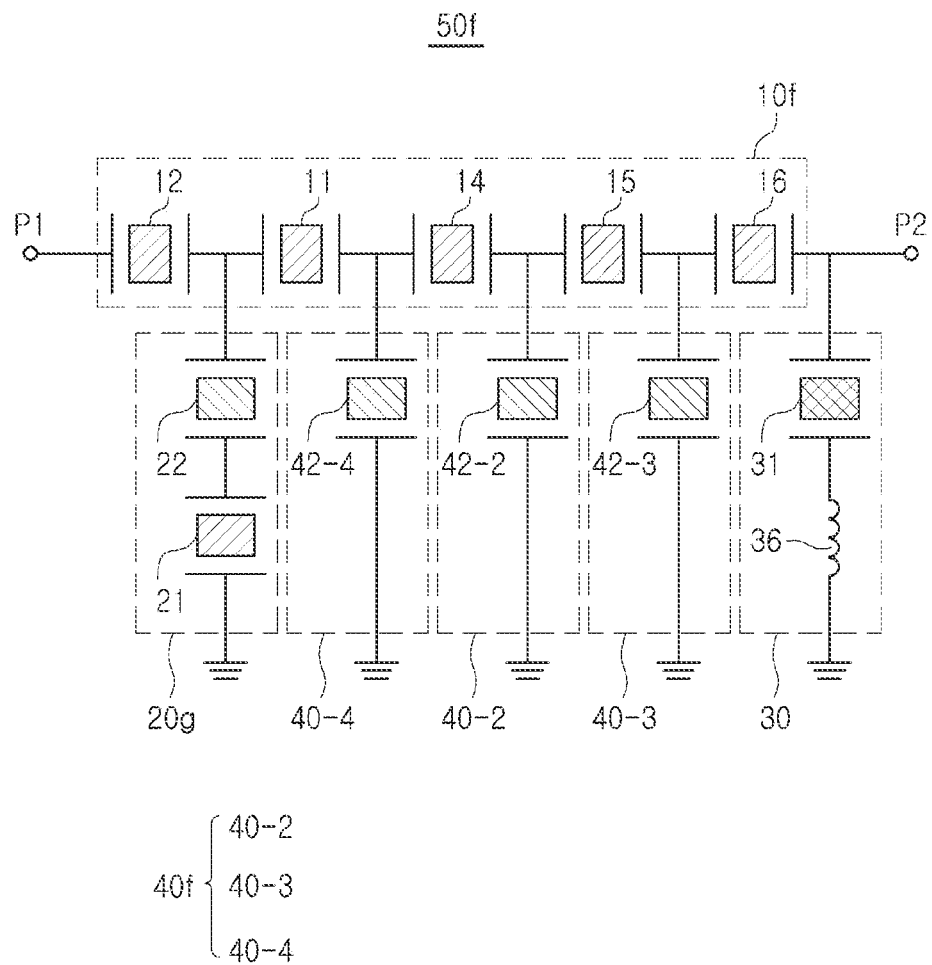

Referring to FIG. 1F, a third shunt unit 40f of the acoustic resonator filter 50f may include a plurality of third shunt units 40-2, 40-3, and 40-4 including second shunt acoustic resonators 42-2, 42-3, and 42-4, respectively, and the series unit 10f may include a plurality of series acoustic resonators 11, 12, 14, 15, and 16. The third shunt units 40-2, 40-3, and 40-4 may be electrically connected in respective connection paths between nodes between the series acoustic resonators 11, 12, 14, 15, and 16 and a ground. For example, the third shunt unit 40-2 may be connected at a node between the series acoustic resonators 14 and 15, the third shut unit 40-3 may be connected at a node between the series acoustic resonators 15 and 16, and the third shunt unit 40-4 may be connected at a node between the series acoustic resonators 11 and 14.

The number of the second shunt acoustic resonators 22, 42-2, 42-3, and 42-4 may be greater than the number of the first shunt acoustic resonators 21 and 31.

Accordingly, the second shunt acoustic resonators 22, 42-2, 42-3, 42-4 may form a main bandwidth of the acoustic resonator filter 50f, and the first shunt acoustic resonators 21 and 31 may widen the main bandwidth of the acoustic resonator filter 50f or make a skirt characteristic of the main bandwidth sharper.

Figure 1G:
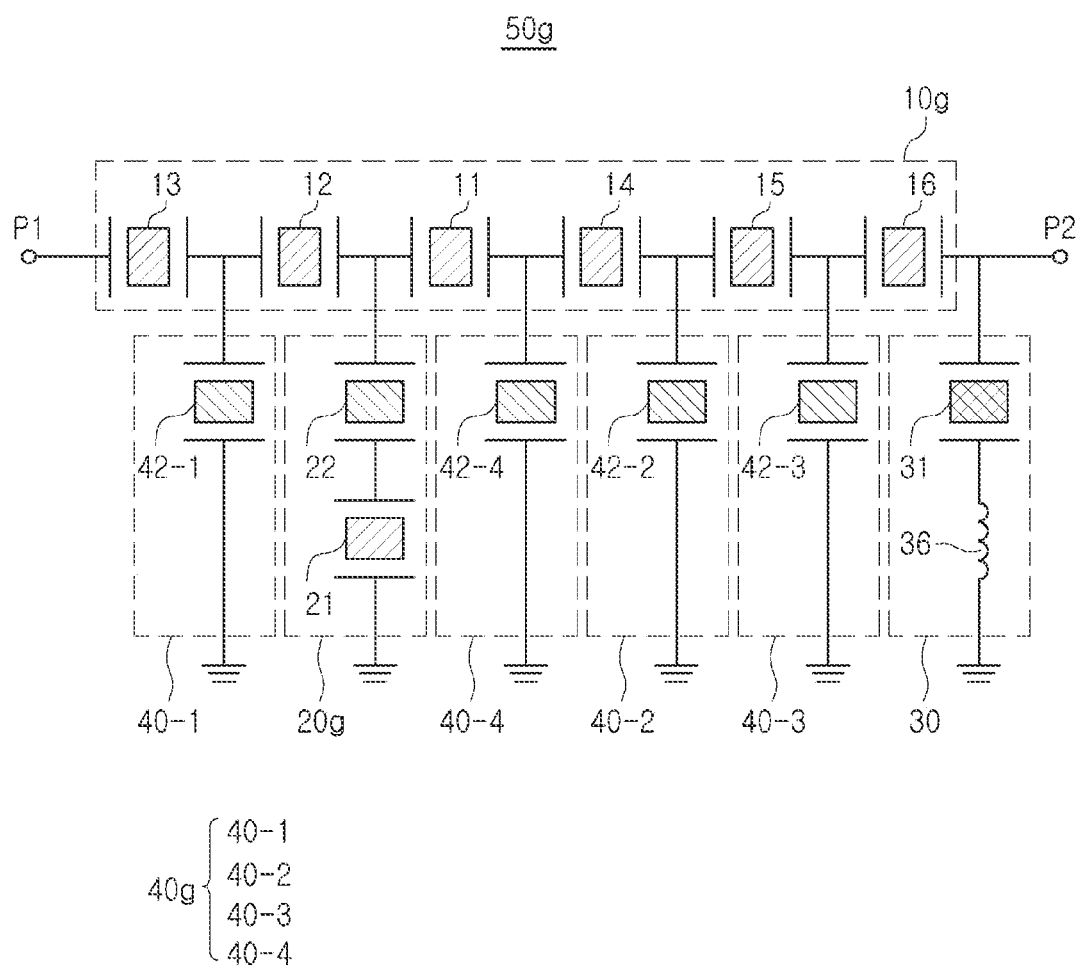

Referring to FIG. 1G, a third shunt unit 40g of the acoustic resonator filter 50g may include a plurality of third shunt units 40-1, 40-2, 40-3, and 40-4 including the second shunt acoustic resonators 42-1, 42-2, and 42-3, and 42-4, respectively. A series unit 10g of the acoustic resonator filter 50g may include a plurality of series acoustic resonators 11, 12, 13, 14, 15, and 16.

Figure 1H:
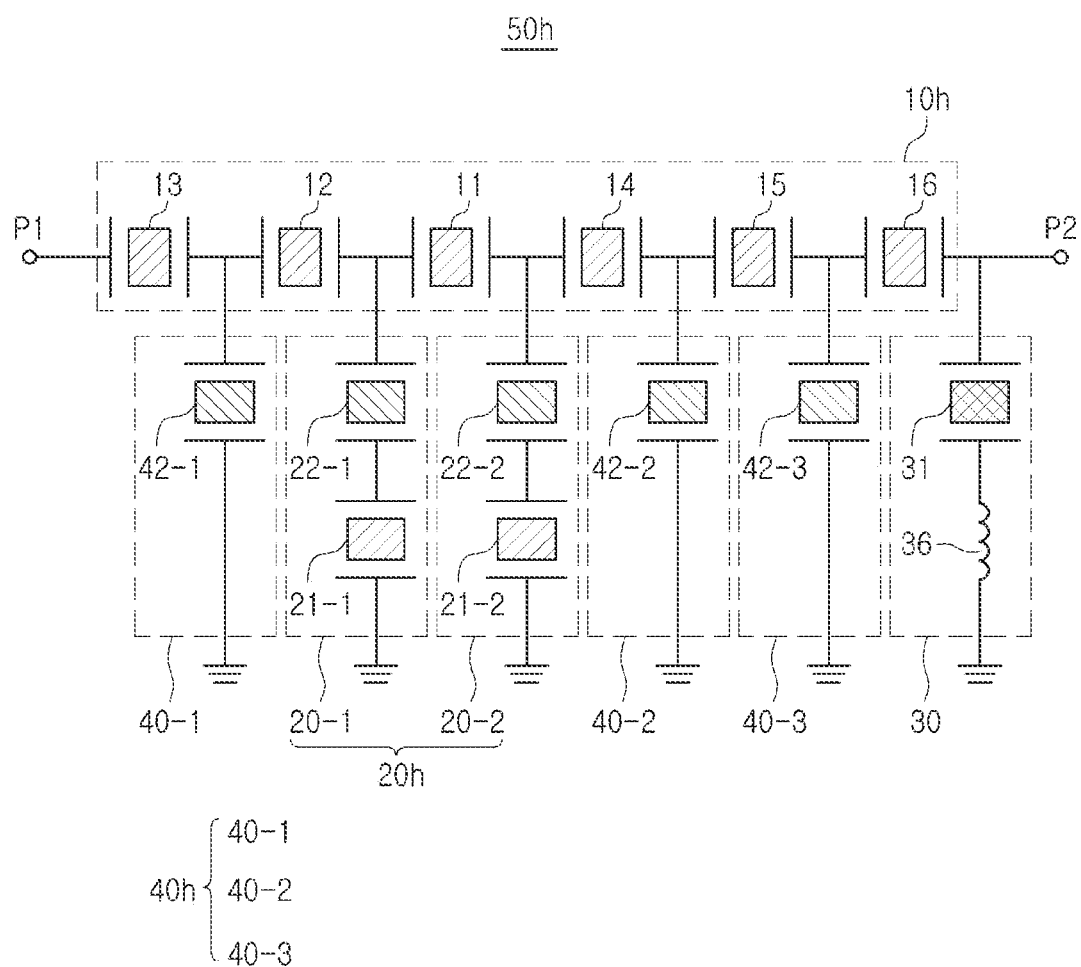

Referring to FIG. 1H, a first shunt unit 20h of the acoustic resonator filter 50h may include a plurality of first shunt units 20-1 and 20-2 disposed in the plurality of first shunt connection paths between at least one series acoustic resonator 11, 12, 13, 14, 15, and 16 and a ground.

The plurality of first shunt units 20-1 and 20-2 may include first shunt acoustic resonators 21-1 and 21-2, respectively, and second shunt acoustic resonators 22-1 and 22-2, respectively.

At least one series acoustic resonator 11 of the plurality of series acoustic resonators 11, 12, 13, 14, 15, and 16 of a series unit 10h may be electrically connected between a plurality of first shunt units 20-1 and 20-2.

The number of the first shunt acoustic resonators 21-1 and 21-2 respectively electrically connected to the second shunt acoustic resonators 22-1 and 22-2 in series may be greater than the number of the first shunt acoustic resonators 31 electrically connected to the inductor 36 in series. Accordingly, a skirt characteristic of the acoustic resonator filter 50h may be sharper.

Figure 2A:
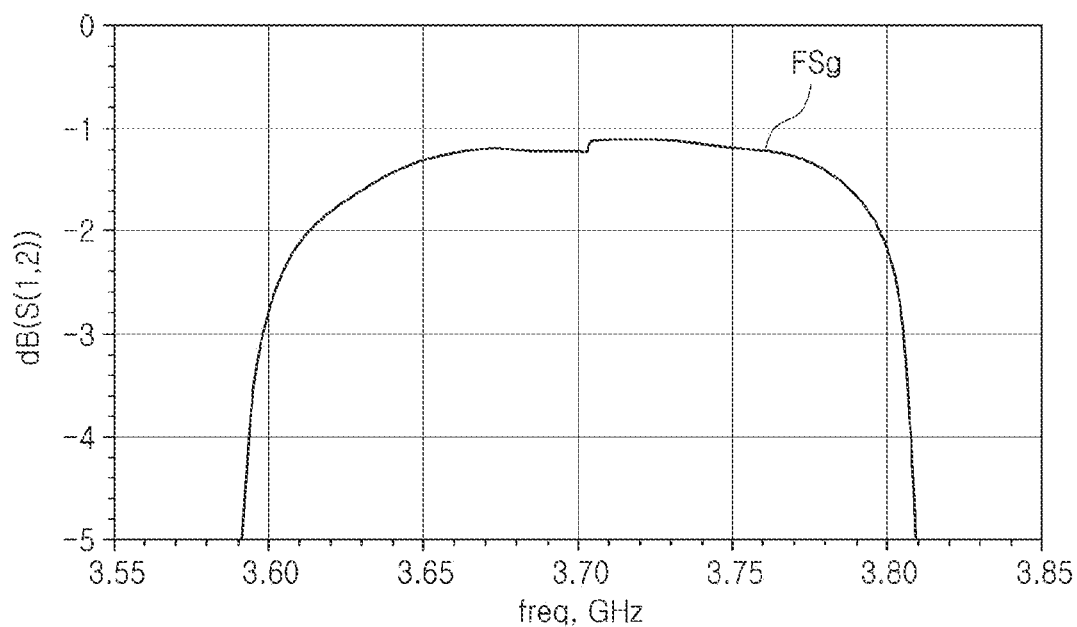
FIG. 2A is a graph illustrating a bandwidth of the acoustic resonator filter shown in FIG. 1G, according to an embodiment.
Figure 2B:
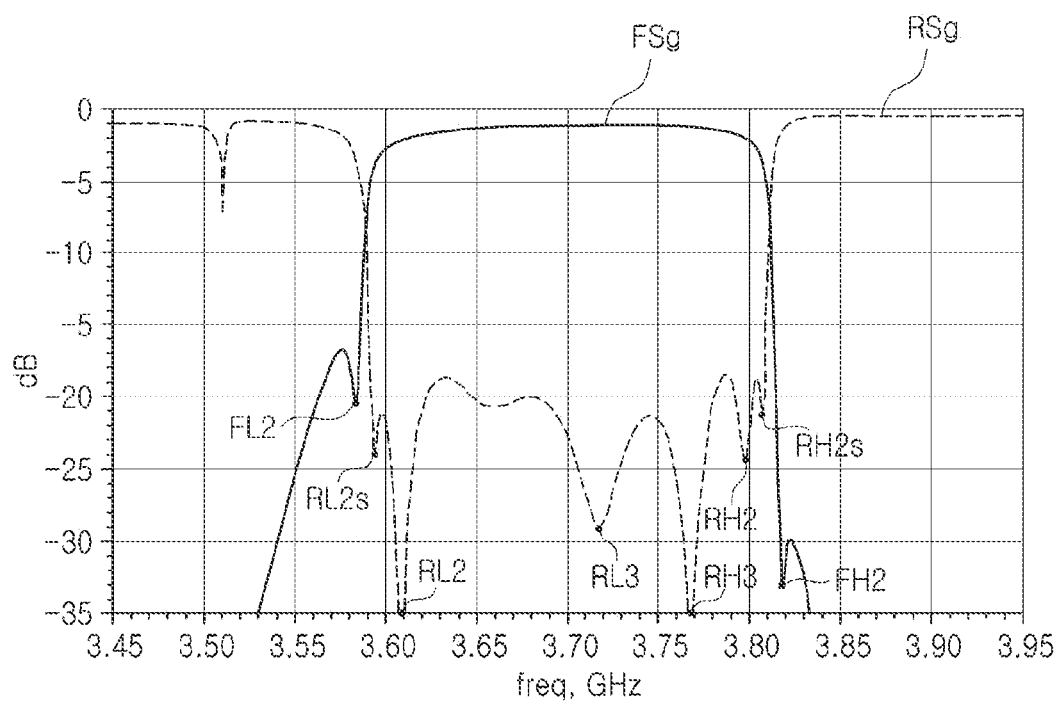
FIG. 2B is a graph illustrating an S-parameter of the acoustic resonator filter shown in FIG. 1G, according to an embodiment.
Figure 3A:
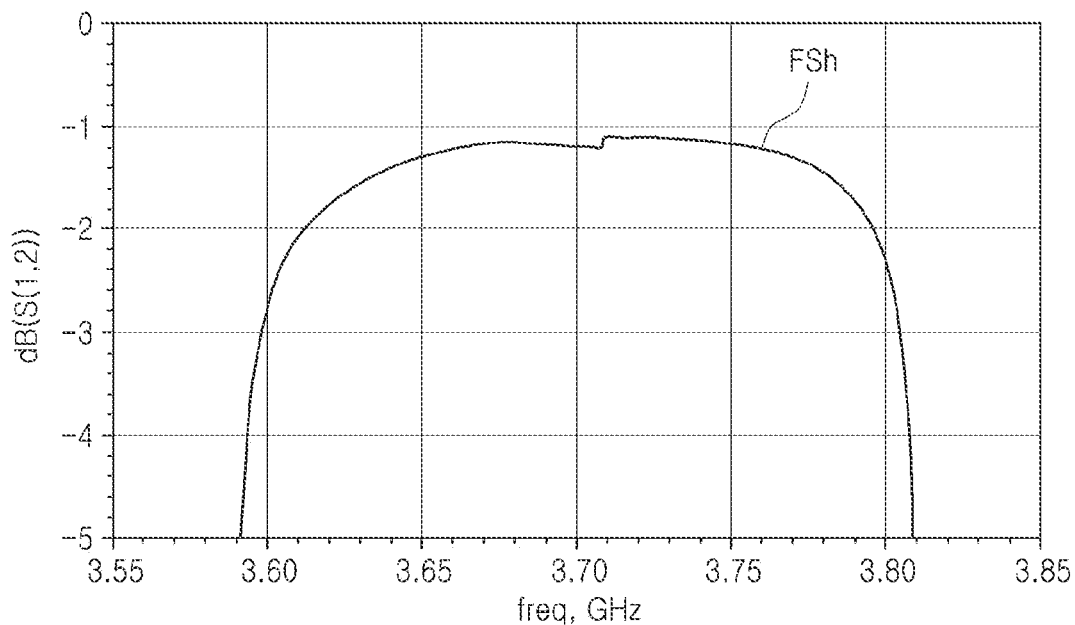
FIG. 3A is a graph illustrating a bandwidth of the acoustic resonator filter shown in FIG. 1H, according to an embodiment.
Figure 3B:
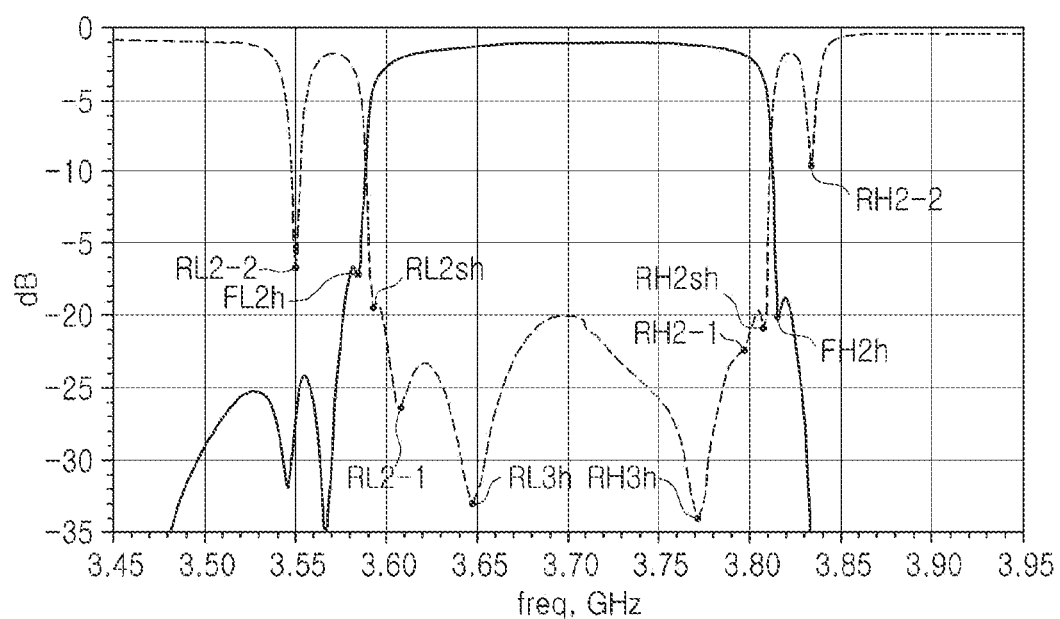
FIG. 3B is a graph illustrating an S-parameter of the acoustic resonator filter shown in FIG. 1H, according to an embodiment.

FIG. 2A is a graph illustrating a bandwidth of the acoustic resonator filter 50g shown in FIG. 1G. FIG. 2B is a graph illustrating an S-parameter of the acoustic resonator filter 50g shown in FIG. 1G. FIG. 3A is a graph illustrating a bandwidth of the acoustic resonator filter 50h shown in FIG. 1H. FIG. 3B is a graph illustrating an S-parameter of the acoustic resonator filter 50h shown in FIG. 1H.

Referring to FIGS. 2A and 3A, a ripple characteristic (pass band ripple) corresponding to variability of S-parameters FSg and FSh between the first port and the second port in the bandwidth of the acoustic resonator filter may be more stable, and an insertion loss corresponding to an overall value of the S-parameters FSg and FSh in the bandwidth may be low.

Referring to FIG. 2B, the S-parameter FSg between the first port and the second port may have a transmission zero pole FL2 formed near the lowest frequency of the bandwidth and a transmission zero pole FH2 formed near the highest frequency of the bandwidth, and the S-parameter RSg between the first port and the first port may have poles RL3 and RH3 according to the second shunt unit and poles RL2, RH2, RL2s, and RH2s according to the first and/or third shunt units.

Transmission zero poles FL2 and FH2 may be formed due to a difference in resonance frequency of the first and second shunt acoustic resonators of the first shunt unit. A slope of the S-parameter FSg in a frequency range of 3.58 GHz to 3.60 GHz may be steeper due to the transmission zero pole FL2, and a slope of the S-parameter FSg in the frequency range of 3.80 GHz to 3.82 GHz may be even steeper due to the transmission zero pole FH2.

The poles RL3 and RH3 according to the second shunt unit may be formed by serial connection between the first shunt acoustic resonator and the inductor, may be located relatively closer to a center frequency of the bandwidth (e.g., 3.70 GHz), and may reduce insertion loss of the S-parameter FSg that may occur as the bandwidth increases.

Referring to FIG. 3B, the S-parameter FSh between the first port and the second port may have a transmission zero pole FL2h formed near the lowest frequency of the bandwidth and a transmission zero pole FH2h formed near the highest frequency of the bandwidth, and the S-parameter RSh between the first port and the first port may have poles RL3h and RH3h according to the second shunt unit and poles RL2-1, RH2-1, RL2sh, RH2sh, RL2-2, and RH2-2 according to the first and/or third shunt units.

Some RL2-2 and RH2-2 of the poles RL2-1, RH2-1, RL2sh, RH2sh, RL2-2, and RH2-2 according to the first and/or third shunt units may be formed by replacing one of the third shunt units with the first shunt unit and may make the slope of the S-parameter FSg in the frequency range of 3.58 GHz to 3.60 GHz and the frequency range of 3.80 GHz to 3.82 GHz steeper.

Figure 4:
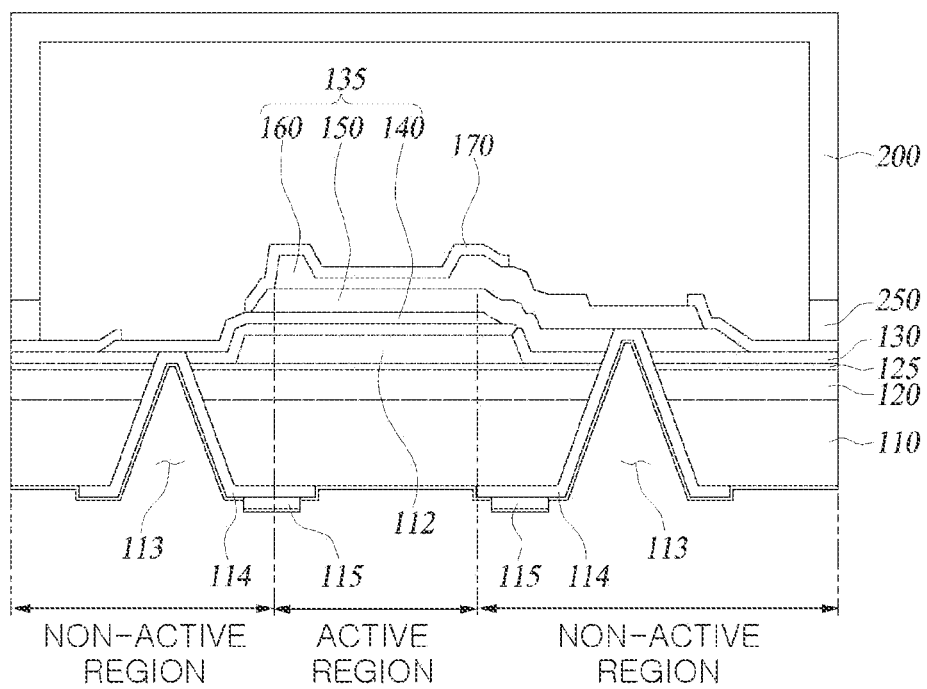
FIG. 4 is a side view illustrating a detailed structure of an acoustic resonator of an acoustic resonator filter, according to an embodiment.

FIG. 4 is a side view illustrating a detailed structure of an acoustic resonator 10 of an acoustic resonator filter, according to an embodiment.

Referring to FIG. 4, the acoustic resonator 10 may be a bulk acoustic resonator, a film bulk acoustic resonator (FBAR), or a solidly mounted resonator (SMR) type resonator. For convenience, the acoustic resonator 10 will hereafter be referred to as a bulk acoustic resonator.

The bulk acoustic resonator 10 may include a stacked structure including a substrate 110, an insulating layer 120, an air cavity 112, and a resonance part 135, and a cap 200 coupled to the stacked structure.

The substrate 110 may include a conventional silicon substrate, and the insulating layer 120 may be provided on an upper surface of the substrate 110 to electrically isolate the resonance part 135 from the substrate 110. The insulating layer 120 may be formed on the substrate 110, using one of silicon dioxide ($SiO_2$) and aluminum oxide ($Al_2O_3$), by chemical vapor deposition, RF magnetron sputtering, or evaporation.

The air cavity 112 may be disposed on the insulating layer 120. The air cavity 112 may be located below the resonance part 135 so that the resonance part 135 may vibrate in a predetermined direction. The air cavity 112 may be formed by a process of forming a sacrificial layer on the insulating layer 120, forming a membrane 130 on the sacrificial layer, and etching the sacrificial layer to remove the sacrificial layer. The membrane 130 may function as an oxide protective layer or as a protective layer protecting the substrate 110.

An etch stop layer 125 may be additionally formed between the insulating layer 120 and the air cavity 112. The etch stop layer 125 protects the substrate 110 and the insulating layer 120 from an etching process and may serve as a base for depositing other layers on the etch stop layer 125.

A seed layer for improving crystal orientation of a piezoelectric layer 150 may be additionally disposed below the first electrode 140. The seed layer may be formed of any one of aluminum nitride (AlN), zinc oxide (ZnO), and lead zirconium titanium oxide (PZT; PbZrTiO) having the same degree of crystallinity as the piezoelectric layer 150.

The resonance part 135 may include an active region and an inactive region. The active region of the resonance part 135, which vibrates to resonate in a predetermined direction by a piezoelectric phenomenon that occurs in the piezoelectric layer 150 when electric energy such as a radio frequency signal is applied to the first electrode 140 and the second electrode 160, is a region in which the first electrode 140, the piezoelectric layer 150, and the second electrode 160 vertically overlap above the air cavity 112. The inactive region of the resonance part 135, is a region that does not resonate by the piezoelectric phenomenon even when electric energy is applied to the first electrode 140 and the second electrode 160, and is disposed outside the active region.

The resonance part 135 outputs a radio frequency signal having a specific frequency using the piezoelectric phenomenon. For example, the resonance part 135 may output a radio frequency signal having a resonance frequency corresponding to the vibrations caused by the piezoelectric phenomenon of the piezoelectric layer 150.

The first and second electrodes 140 and 160 may be formed using a conductive material such as molybdenum (Mo) or an alloy thereof in order to improve coupling efficiency with the piezoelectric layer 150, but is not limited thereto. That is, the first and second electrodes 140 and 160 may be formed of a conductive material such as ruthenium (Ru), tungsten (W), iridium (Ir), platinum (Pt), copper (Cu), titanium (Ti), tantalum (Ta), nickel (Ni), chromium (Cr), or an alloy of ruthenium (Ru), tungsten (W), iridium (Ir), platinum (Pt), copper (Cu), titanium (Ti), tantalum (Ta), nickel (Ni), or chromium (Cr).

The piezoelectric layer 150 may include a piezoelectric material to generate a piezoelectric effect that converts electrical energy into mechanical energy in the form of an elastic wave. For example, the piezoelectric material may include any one of aluminum nitride (AlN), zinc oxide (ZnO), and lead zirconium titanium oxide (PZT; PbZrTiO), may further include either one or both of a rare earth metal and a transition metal, and may include magnesium (Mg), which is a divalent metal. For example, the rare earth metal may include any one or any combination of any two or more of scandium (Sc), erbium (Er), yttrium (Y), and lanthanum (La), and the transition metal may include any one or any combination of any two or more of titanium (Ti), zirconium (Zr), hafnium (Hf), tantalum (Ta), and niobium (Nb).

A protective layer 170 may be disposed on the second electrode 160 of the resonance part 135 to prevent the second electrode 160 from being exposed to the outside. The protective layer 170 may be formed of any one of a silicon oxide-based insulating material, a silicon nitride-based insulating material, and an aluminum nitride-based insulating material. In FIG. 4, one stacked structure is shown to be accommodated in one cap 200, but a plurality of stacked structures may be accommodated in one cap 200 and the plurality of stacked structures may be interconnected according to design. In the plurality of stacked structures, wiring electrodes may be provided on externally exposed portions of the first electrode 140 and the second electrode 160, and may be interconnected.

The cap 200 may be bonded to the stacked structure to protect the resonance part 135 from an external environment. The cap 200 may be formed in the shape of a cover having an internal space in which the resonance part 135 is accommodated. For example, the cap 200 may have an accommodating part formed at the center thereof to accommodate the resonant part 135 and may be coupled to the stacked structure at the edges thereof. In FIG. 4, the cap 200 is shown to be bonded to the protective layer 170 stacked on the substrate 110, but, alternatively, the cap 200 may be bonded to any one or any combination of any two or more of the membrane 130 and the etch stop layer 125, the insulating layer 120, and the substrate 110 through the protective layer 170.

The cap 200 may be bonded to the substrate 110 by eutectic bonding. In this case, after a bonding agent 250 enabling eutectic bonding with the substrate 110 is deposited on the stacked structure, a substrate wafer and a cap wafer may be pressed and heated for bonding. The bonding agent 250 may include a eutectic material of copper (Cu)-tin (Sn) and may include solder balls as well.

At least one via hole 113 penetrating the substrate 110 in a thickness direction may be formed on a lower surface of the substrate 110. The via hole 113 may penetrate portions of the insulating layer 120, the etch stop layer 125, and the membrane 130, as well as the substrate 110, in the thickness direction. A connection pattern 114 may be formed inside the via hole 113, and the connection pattern 114 may be formed on an inner surface of the via hole 113, that is, on the entire inner wall of the via hole 113. The via hole 113 may be omitted according to design, and the structure of the connection pattern 114 may be replaced with a wire bonding structure.

The connection pattern 114 may be manufactured by forming a conductive layer on an inner surface of the via hole 113. For example, the connection pattern 114 may be formed by depositing, coating, or filling a conductive metal such as gold or copper along the inner wall of the via hole 113. For example, the connection pattern 114 may be formed of a titanium (Ti)-copper (Cu) alloy.

The connection pattern 114 may be connected to either one or both of the first electrode 140 and the second electrode 160. For example, the connection pattern 114 may be electrically connected to either one or both of the first electrode 140 and the second electrode 160 through at least portions of the substrate 110, the membrane 130, the first electrode 140, and the piezoelectric layer 150. The connection pattern 114 formed on the inner surface of the via hole 113 may extend toward a lower surface of the substrate 110 and may be connected to a connection pad 115 for a substrate provided on the lower surface of the substrate 110. Accordingly, the connection pattern 114 may electrically connect the first electrode 140 and the second electrode 160 to the connection pad 115 for a substrate.

The connection pad 115 may be electrically connected to an external substrate that may be disposed below the bulk acoustic resonator 10 through the bump. The bulk acoustic resonator 10 may perform a filtering operation of an RF signal by a signal applied to the first and second electrodes 110 and 120 through the connection pad 115.

As set forth above, an acoustic resonator filter may obtain a wider pass bandwidth and a sharper skirt characteristic together.

In an acoustic resonator filter according to embodiments disclosed herein, the structure for obtaining a wider pass bandwidth and the structure for obtaining a sharper skirt characteristic are complementary to each other, so that a wide pass bandwidth and a sharp skirt characteristic may be obtained efficiently and the balance between the pass bandwidth and the skirt characteristic may be more efficiently adjusted according to the standard required for the acoustic resonator filter.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator filter, comprising:
   a series unit including at least one series acoustic resonator electrically connected, in series, between first and second ports configured to pass a radio frequency (RF) signal;
   a first shunt unit disposed on a first shunt connection path between the at least one series acoustic resonator and a ground, the first shunt unit including a plurality of shunt acoustic resonators connected to each other in series and having different resonance frequencies; and
   a second shunt unit disposed in a second shunt connection path between the at least one series acoustic resonator and the ground, the second shunt unit including at least one shunt acoustic resonator and an inductor electrically connected to the at least one shunt acoustic resonator included in the second shunt unit, in series, the second shunt unit having higher inductance than inductance of the first shunt unit.

2. The acoustic resonator filter of claim 1, further comprising:
   a third shunt unit disposed in a third shunt connection path between the at least one series acoustic resonator and the ground, and including at least one shunt acoustic resonator having a resonance frequency lower than a higher resonance frequency among a plurality of resonance frequencies of the plurality of shunt acoustic resonators included in the first shunt unit, and lower than at least one resonance frequency of the at least one shunt acoustic resonator included in the second shunt unit.

3. The acoustic resonator filter of claim 2, wherein the at least one resonance frequency of the at least one shunt acoustic resonator included in the third shunt unit is the same as a lower resonance frequency among the plurality of resonance frequencies of the plurality of shunt acoustic resonators included in the first shunt unit.

4. The acoustic resonator filter of claim 2, wherein the higher resonance frequency among the plurality of resonance frequencies of the plurality of shunt acoustic resonators included in the first shunt unit is equal to or higher than at least one resonance frequency of the at least one series acoustic resonator.

5. The acoustic resonator filter of claim 2, wherein the higher resonance frequency among the plurality of resonance frequencies of the plurality of shunt acoustic resonators of the first shunt unit is higher than the at least one resonance frequency of the at least one shunt acoustic resonator of the second shunt unit.

6. The acoustic resonator filter of claim 1, further comprising:
   a plurality of third shunt units respectively arranged in a plurality of third shunt connection paths between the at least one series acoustic resonator and the ground,
   wherein the plurality of third shunt units each include at least one shunt acoustic resonator having a resonance frequency lower than a higher resonance frequency among the different resonance frequencies of the plurality of shunt acoustic resonators included in the first shunt unit.

7. The acoustic resonator filter of claim 6, wherein the at least one series acoustic resonator included in the series unit includes a plurality of series acoustic resonators electrically connected between the plurality of third shunt units, and
   wherein the first shunt unit is electrically connected between a node between the plurality of series acoustic resonators and the ground.

8. The acoustic resonator filter of claim 1, wherein the first shunt unit includes a plurality of first shunt units arranged in a plurality of first shunt connection paths between the at least one series acoustic resonator and the ground,
   wherein one of the plurality of first shunt units includes the plurality of shunt acoustic resonators, and
   wherein another one of the plurality of first shunt units includes another plurality of shunt acoustic resonators connected to each other in series and having different resonance frequencies.

9. The acoustic resonator filter of claim 8, wherein the at least one series acoustic resonator of the series unit includes one or more series acoustic resonators electrically connected between the plurality of first shunt units.

10. An acoustic resonator filter, comprising:
    at least one series acoustic resonator electrically connected, in series, between first and second ports configured to pass a radio frequency (RF) signal;

at least one second shunt acoustic resonator electrically shunt-connected between the at least one series acoustic resonator and a ground;

a plurality of first shunt acoustic resonators electrically shunt-connected between the at least one series acoustic resonator and the ground, and having a resonance frequency higher than a resonance frequency of the at least one second shunt acoustic resonator; and an inductor electrically connected to a portion of the plurality of first shunt acoustic resonators in series, wherein at least one first shunt acoustic resonator, among a remaining portion of the plurality of first shunt acoustic resonators, is electrically connected to the at least one second shunt acoustic resonator in series, and wherein an inductance of a shunt connection path in which the inductor is disposed is greater than each of a plurality of inductances of a plurality of shunt connection paths in which the plurality of second shunt acoustic resonators are respectively disposed.

11. The acoustic resonator filter of claim 10, wherein a resonance frequency of the at least one first shunt acoustic resonator among the remaining portion the plurality of first shunt acoustic resonators is equal to or higher than a resonance frequency of the at least one series acoustic resonator.

12. The acoustic resonator filter of claim 10, wherein a resonance frequency of the portion of the plurality of first shunt acoustic resonators is lower than a resonance frequency of at least one first shunt acoustic resonator among a remaining portion of the plurality of first shunt acoustic resonators.

13. The acoustic resonator filter of claim 10, wherein the at least one second shunt acoustic resonator includes a plurality of second shunt acoustic resonators, and wherein a number of the plurality of second shunt acoustic resonators is greater than a number of the plurality of first shunt acoustic resonators.

14. The acoustic resonator filter of claim 13, wherein a number of the at least one first shunt acoustic resonator, among the remaining portion of the plurality of first shunt acoustic resonators, electrically connected to the at least one second shunt acoustic resonator in series is greater than a number of first shunt acoustic resonators, among the portion of the plurality of first shunt acoustic resonators electrically connected to the inductor in series.

\* \* \* \* \*